United States Patent
Tang et al.

(10) Patent No.: US 9,947,369 B2
(45) Date of Patent: Apr. 17, 2018

(54) NETWORK STORAGE DEVICE

(71) Applicant: Huawei Technologies Co., Ltd., Shenzhen (CN)

(72) Inventors: Kun Tang, Chengdu (CN); Qingcheng Huang, Shenzhen (CN); Dechun Bi, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/207,099

(22) Filed: Jul. 11, 2016

(65) Prior Publication Data
US 2016/0322083 A1 Nov. 3, 2016

Related U.S. Application Data

(63) Continuation of application No. PCT/CN2015/071030, filed on Jan. 19, 2015.

(30) Foreign Application Priority Data

May 4, 2014 (CN) .......................... 2014 1 0184913

(51) Int. Cl.
*H05K 5/00* (2006.01)
*G11B 33/02* (2006.01)
(Continued)

(52) U.S. Cl.
CPC .............. *G11B 33/02* (2013.01); *G06F 3/06* (2013.01); *G11B 33/128* (2013.01);
(Continued)

(58) Field of Classification Search
CPC ..... G11B 33/02; G11B 33/128; G11B 33/142; G06F 3/06; H05K 5/0021; H05K 5/0217; H05K 7/14; H05K 7/02572
See application file for complete search history.

(56) References Cited

U.S. PATENT DOCUMENTS 6,283,429 B1 * 9/2001 Markovich ........... G06F 1/1632
248/286.1
8,762,774 B2 * 6/2014 Wu ..................... G06F 11/2025
714/11
(Continued)

FOREIGN PATENT DOCUMENTS

CN 101075930 A 11/2007
CN 101325603 A 12/2008
(Continued)

OTHER PUBLICATIONS

Partial English Translation and Abstract of Chinese Patent Application No. CN101325603, Jul. 29, 2016, 4 pages.
(Continued)

*Primary Examiner* — James Wu
*Assistant Examiner* — Hung Dang
(74) *Attorney, Agent, or Firm* — Conley Rose, P.C.

(57) ABSTRACT

A network storage device is provided, where the network storage device includes a cabinet, a network switch, and a hard disk area, where the network switch and the hard disk area are installed inside the cabinet, the hard disk area includes at least one hard disk, each hard disk is fastened to the cabinet using a mounting bracket, each hard disk in the hard disk area and the network switch have a same type of interface, and the hard disk and the network switch are connected using a cable or a printed circuit board (PCB). Using the network storage device, a problem that storage density is limited is resolved, and expansion flexibility is high.

20 Claims, 4 Drawing Sheets

(51) Int. Cl.
- *G06F 3/06* (2006.01)
- *G11B 33/14* (2006.01)
- *H05K 5/02* (2006.01)
- *H05K 7/14* (2006.01)
- *H05K 7/20* (2006.01)
- *G11B 33/12* (2006.01)

(52) U.S. Cl.
CPC ......... *G11B 33/142* (2013.01); *H05K 5/0021* (2013.01); *H05K 5/0217* (2013.01); *H05K 7/14* (2013.01); *H05K 7/20572* (2013.01)

(56) References Cited

U.S. PATENT DOCUMENTS

| | | | |
|---|---|---|---|
| 2008/0010647 A1 | 1/2008 | Chapel et al. | |
| 2012/0293932 A1* | 11/2012 | Jai | H05K 7/1491 361/679.02 |
| 2015/0076976 A1* | 3/2015 | Bailey | H05K 5/023 312/223.6 |

FOREIGN PATENT DOCUMENTS

| | | |
|---|---|---|
| CN | 202563385 U | 11/2012 |
| CN | 103927137 A | 7/2014 |
| EP | 1858227 A1 | 11/2007 |

OTHER PUBLICATIONS

Partial English Translation and Abstract of Chinese Patent Application No. CN202563385, Jul. 29, 2016, 2 pages.
Partial English Translation and Abstract of Chinese Patent Application No. CN103927137, Part 1, Jul. 29, 2016, 4 pages.
Partial English Translation and Abstract of Chinese Patent Application No. CN103927137, Part 2, Jul. 29, 2016, 2 pages.
Foreign Communication From a Counterpart Application, Chinese Application No. 201410184913.3, Chinese Office Action dated Apr. 25, 2016, 6 pages.
Foreign Communication From a Counterpart Application, PCT Application No. PCT/CN2015/071030, English Translation of International Search Report dated Apr. 20, 2015, 2 pages.
Foreign Communication From a Counterpart Application, PCT Application No. PCT/CN2015/071030, English Translation of Written Opinion dated Apr. 20, 2015, 8 pages.

* cited by examiner

US 9,947,369 B2

NETWORK STORAGE DEVICE

CROSS-REFERENCE TO RELATED APPLICATION

This application is a continuation of International Application No. PCT/CN2015/071030, filed on Jan. 19, 2015, which claims priority to Chinese Patent Application No. 201410184913.3, filed on May 4, 2014, both of which are hereby incorporated by reference in their entireties.

TECHNICAL FIELD

The present disclosure relates to network technologies, and in particular, to a network storage device.

BACKGROUND

A network storage device is an application system that stores data of a user on the Internet. Whenever and wherever possible, the user can upload a file to the network storage device, can download a file from the network storage device, can manage a file stored in the network storage device, or can share a file stored in the network storage device with another person.

Currently, most network storage devices are implemented using a network hard disk that has a network function. The network storage device is based on a hard disk that supports the serial attached SCSI (SAS) (where SCSI referred to small computer system interface)/a serial at attachment (SATA) hard disk, a converting circuit is added to an exterior of the hard disk, and a network interface is provided using the converting circuit. FIG. 1 is a schematic structural diagram of an existing network storage device, and FIG. 2 is a cross-sectional view of a storage shelf in FIG. 1 in an A-A direction. As shown in FIG. 1, a cabinet 14 includes a network switch 11 and multiple storage shelves 12, the storage shelves 12 are connected to the network switch 11 using a cable 13 to implement a function of storing data of a device and a user, and the multiple storage shelves 12 are installed inside the cabinet 14 in stack mode. As shown in FIG. 2, a switch board 21, a heat dissipation unit 22, and a hard disk area 23 are integrated in each storage shelf 12, and multiple hard disk units 24 can be disposed in the hard disk area 23, to form a storage array.

However, as network users gradually increase, a requirement for a network storage capacity is increasingly high. When a solution in the prior art is used for expansion, storage shelves need to be expanded one by one, storage density is limited, and expansion flexibility is not high.

SUMMARY

Embodiments of the present disclosure provide a network storage device in order to resolve a problem in the prior art that storage density is limited and expansion flexibility is not high.

An embodiment of the present disclosure provides a network storage device, where the network storage device includes a cabinet, a network switch, and a hard disk area, the network switch and the hard disk area are installed inside the cabinet, the hard disk area includes at least one hard disk, each hard disk is fastened to the cabinet using a mounting bracket, each hard disk in the hard disk area and the network switch have a same type of interface, and the hard disk and the network switch are connected using a cable or a printed circuit board (PCB).

The network storage device further includes a heat dissipation apparatus, and the heat dissipation apparatus is disposed inside the cabinet.

Further, the network switch, the heat dissipation apparatus, and the hard disk area are successively deployed in a vertical direction of the cabinet.

Still further, the heat dissipation apparatus includes at least one heat dissipation unit, and all the heat dissipation units are successively deployed in a horizontal direction of the cabinet.

Still further, based on the network storage device, all the hard disks in the hard disk area are successively deployed in the vertical direction of the cabinet, and all the hard disks are deployed in one row in the horizontal direction of the cabinet.

Still further, based on the network storage device, all the hard disks in the hard disk area are successively deployed in the vertical direction of the cabinet, and all the hard disks are deployed in two rows in the horizontal direction of the cabinet.

Still further, all the hard disks in the hard disk area are fastened to side walls of the cabinet using the mounting brackets, and the cabinet has a front door and a rear door.

Still further, based on the network storage device, at least one row of hard disks is installed on an inner door wall of the front door from top to bottom, and all the hard disks are deployed in one row in the horizontal direction of the cabinet, and/or at least one row of hard disks is installed on an inner door wall of the rear door from top to bottom, and all the hard disks are deployed in one row in the horizontal direction of the cabinet.

According to the network storage device in the embodiment of the present disclosure, a network switch and a hard disk area are integrated in a cabinet, and all devices are densely disposed, thereby resolving a problem that storage density is limited. Each hard disk is fastened to the cabinet using a mounting bracket such that when a requirement for a storage capacity of the network storage device increases, expansion may be performed by increasing a quantity of mounting brackets that fasten hard disks, and expansion flexibility is high.

Figure 1:
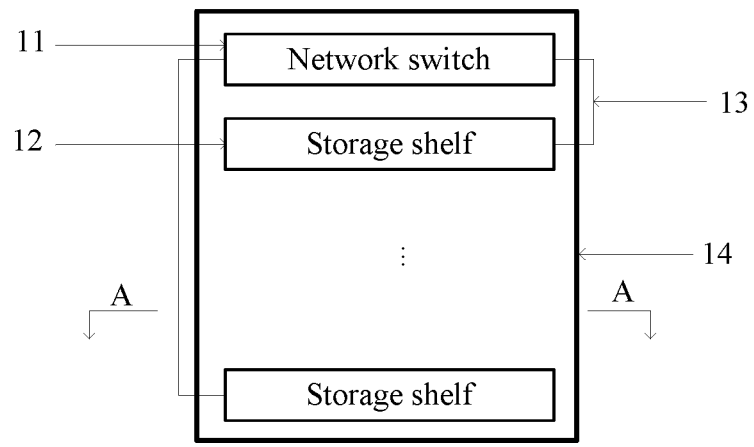
FIG. 1 is a schematic structural diagram of an existing network storage device.
Figure 2:
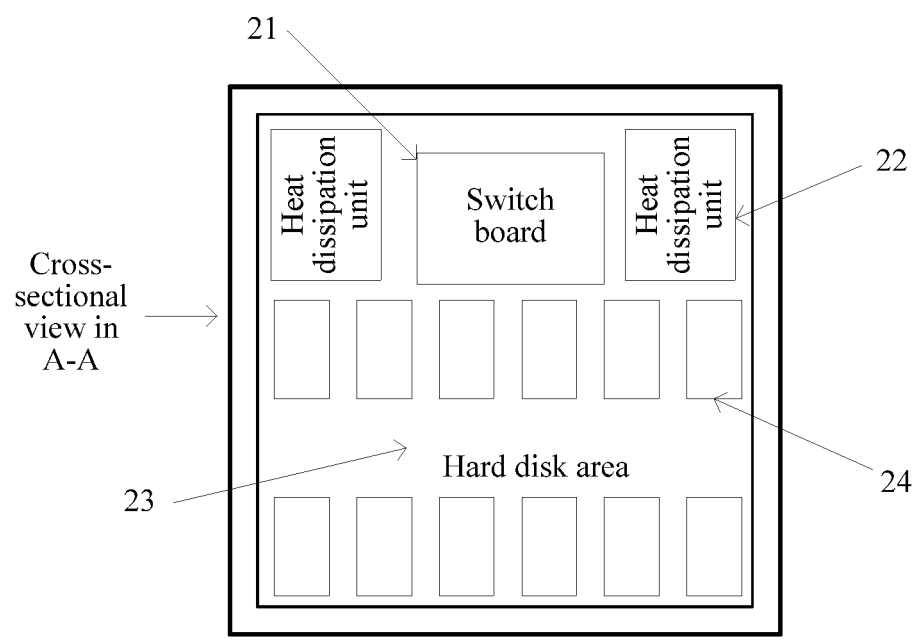
FIG. 2 is a cross-sectional view of a storage shelf in FIG. 1 in an A-A direction.

Explanations of reference numerals are as follows:

11, 32, and 42: Network switch;
12: Storage shelf;
13: Cable;
14: Cabinet;
21: Switch board;
22 and 46: Heat dissipation unit;
23: Hard disk area;
24: Hard disk unit
31, 41, 51, 61, 71, and 81: Cabinet;
33 and 43: Heat dissipation apparatus;
34 and 44: Hard disk area;
35, 45, 52, 62, 72, and 82: Hard disk;
73 and 83: Front door; and
74 and 84: Rear door.

DESCRIPTION OF EMBODIMENTS

Figure 3:
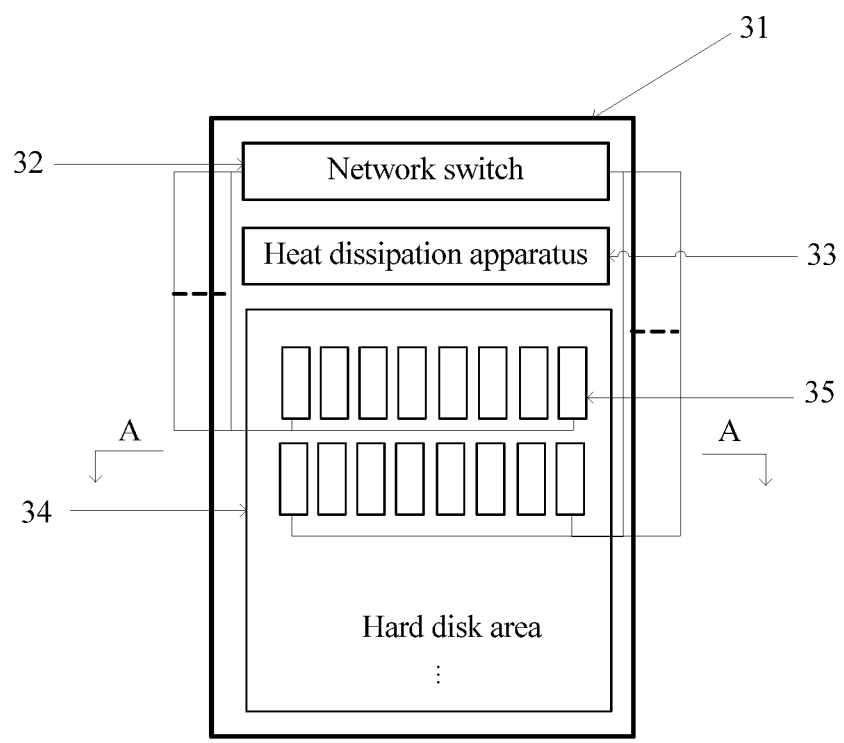
FIG. 3 is a schematic structural diagram of a network storage device according to Embodiment 1 of the present disclosure.

FIG. 3 is a schematic structural diagram of a network storage device according to Embodiment 1 of the present disclosure. As shown in FIG. 3, the network storage device includes a cabinet 31, a network switch 32, and a hard disk area 34. The network switch 32 and the hard disk area 34 are installed inside the cabinet 31, the hard disk area 34 includes at least one hard disk 35, each hard disk 35 is fastened to the cabinet 31 using a mounting bracket, each hard disk 35 in the hard disk area 34 and the network switch 32 have a same type of interface, and the hard disk 35 and the network switch 32 are connected using a cable or a PCB. Each hard disk 35 in the hard disk area 34 and the network switch 32 have a same type of interface means that each hard disk 35 and the network switch 32 have a same-protocol-based interface. The network switch 32 and the hard disk area 34 may be arranged in another form, which is not limited herein.

According to the network storage device in this embodiment, a network switch and a hard disk area are integrated in a cabinet, multiple hard disks may be disposed in the hard disk area, a quantity of hard disks in the hard disk area may be flexibly set according to a requirement, and all devices are densely disposed, thereby greatly alleviating a problem that storage density is limited. Each hard disk is fastened to the cabinet using a mounting bracket such that when a requirement for a storage capacity of the network storage device increases, expansion may be performed by increasing a quantity of mounting brackets that fasten hard disks, and expansion flexibility is high.

Preferably, based on Embodiment 1 described above, the network storage device further includes a heat dissipation apparatus 33, and the heat dissipation apparatus 33 is disposed inside the cabinet. The network switch 32 expands connection of a network, and provides more connection ports for a subnet. The heat dissipation apparatus 33 may be a fan, and provides a heat dissipation function for each hard disk 35 to prevent a function of the hard disk 35 from being affected because of the overheated hard disk. The hard disk 35 in the hard disk area 34 is an Internet Protocol (IP) hard disk, which provides an interface such that communication with an upper-layer network can be performed directly using the IP. However, for a conventional hard disk that supports an SAS/SATA interface, a switch board needs to be added to implement communication between the hard disk and an external network. Because the switch board is added, a quantity of link accesses increases, power consumption increases, reliability becomes low, and costs are high. Each hard disk 35 in the hard disk area 34 and the network switch 32 may be further connected using a cable or a PCB.

Figure 4:
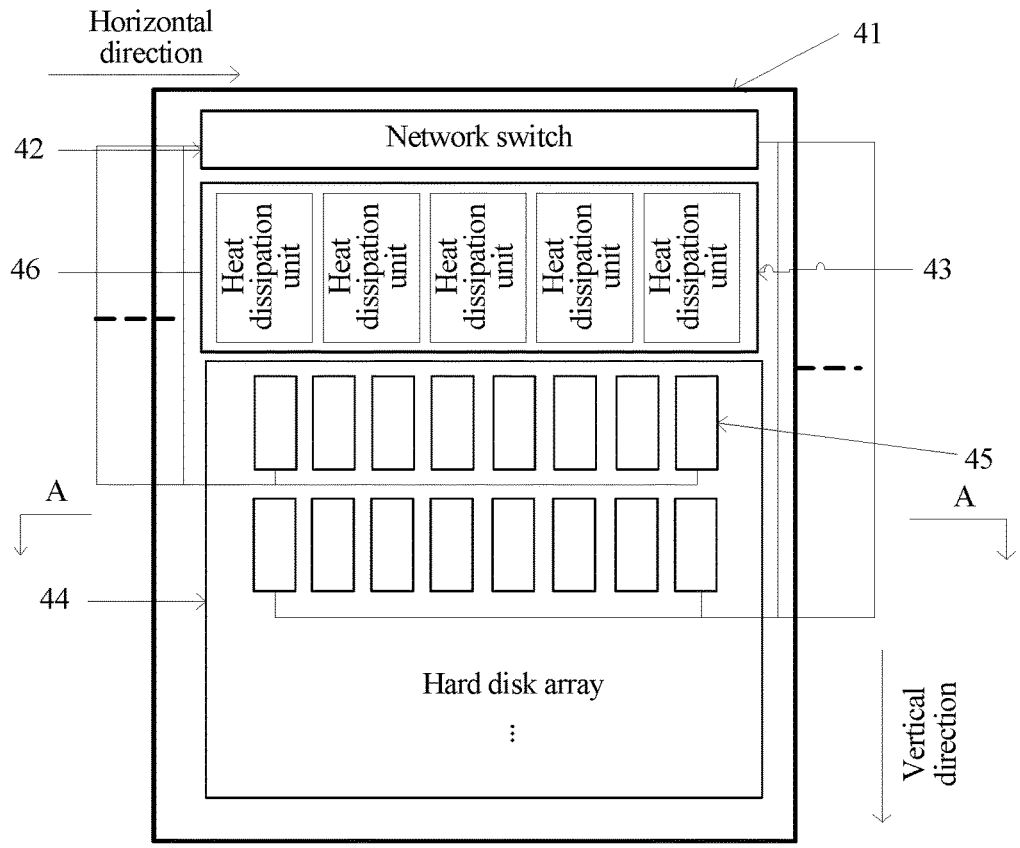
FIG. 4 is a schematic structural diagram of a network storage device according to Embodiment 2 of the present disclosure.
Figure 5:
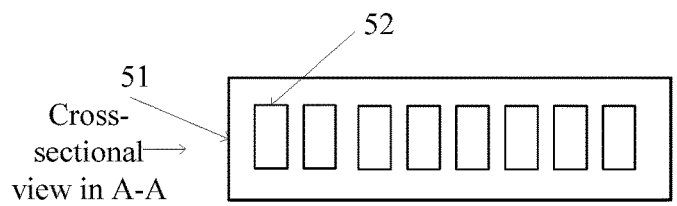
FIG. 5 is a cross-sectional view of a hard disk in Embodiment 2 of the present disclosure in an A-A direction in FIG. 3.

FIG. 4 is a schematic structural diagram of a network storage device according to Embodiment 2 of the present disclosure, and FIG. 5 is a cross-sectional view of a hard disk in Embodiment 2 of the present disclosure in an A-A direction in FIG. 3. As shown in FIG. 4, in Embodiment 2 of the present disclosure, based on the network storage device described above, further, a network switch 42, a heat dissipation apparatus 43, and a hard disk area 44 are successively deployed in a vertical direction of a cabinet 41, where the heat dissipation apparatus 43 includes at least one heat dissipation unit 46, and all the heat dissipation units 46 are successively deployed in a horizontal direction of the cabinet 41. Alternatively, the heat dissipation apparatus 43 may be disposed below the hard disk area 44. All hard disks 45 in the hard disk area 44 are successively deployed in the vertical direction of the cabinet 41. As shown in FIG. 5, all hard disks 52 are deployed in one row in a horizontal direction of a cabinet 51.

According to the network storage device in Embodiment 2 described above, a heat dissipation apparatus is disposed between a network switch and a hard disk area or disposed below a hard disk area, and all heat dissipation units are successively deployed in a horizontal direction of a cabinet, where a quantity of the heat dissipation units may be set according to a requirement and costs, heat dissipation is concentrated, and heat dissipation efficiency is high. In addition, hard disks in the hard disk area are successively deployed in a vertical direction of the cabinet, a quantity of the hard disks in the hard disk area may be set according to a height of the cabinet, all the hard disks are deployed in one row in the horizontal direction of the cabinet, and intervals among the hard disks may be the same. Alternatively, a quantity of the hard disks in the hard disk area may be set according to a width of the cabinet. A hard disk area is disposed in such a manner that a storage capacity can be effectively increased and a problem that storage density is limited is alleviated.

Figure 6:
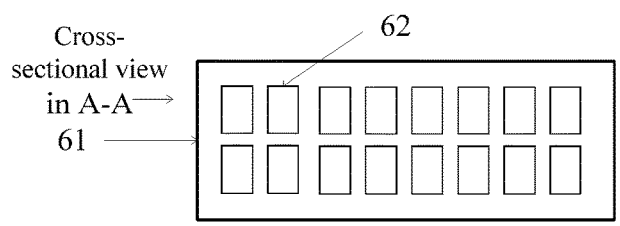
FIG. 6 is a cross-sectional view of a hard disk in a network storage device according to Embodiment 3 of the present disclosure in an A-A direction in FIG. 3.

FIG. 6 is a cross-sectional view of a hard disk in a network storage device according to Embodiment 3 of the present disclosure in an A-A direction in FIG. 3. Based on Embodiment 2 described above, the network switch, the heat dissipation apparatus, and the hard disk area are successively deployed in the vertical direction of the cabinet, where the heat dissipation apparatus includes at least one heat dissipation unit, and all the heat dissipation units are successively deployed in the horizontal direction of the cabinet. Alternatively, the heat dissipation apparatus may be disposed below the hard disk area. All the hard disks in the hard disk area are successively deployed in the vertical direction of the cabinet, and all the hard disks are deployed in two rows in the horizontal direction of the cabinet. As shown in FIG. 6, that hard disks 62 are deployed in two rows in a horizontal direction of a cabinet 61 is that two rows of the hard disks 62 are deployed in the horizontal direction of the cabinet 61. The hard disks 62 are fastened to side walls of the cabinet 61 using mounting brackets. In this case, the cabinet 61 needs to be increased twice as thick as the cabinet in Embodiment 2, and therefore, a storage capacity of the network storage device is further increased. In addition, the cabinet 61 has a front door and a rear door, which facilitates maintenance of the two rows of hard disks 62.

According to the network storage device in Embodiment 3 described above, a cabinet is increased in thickness, and two rows of hard disks are deployed in a horizontal direction of the cabinet, and a hard disk capacity is doubled. In addition, a front door and a rear door are installed in the cabinet, which facilitates maintenance of the hard disks.

Figure 7:
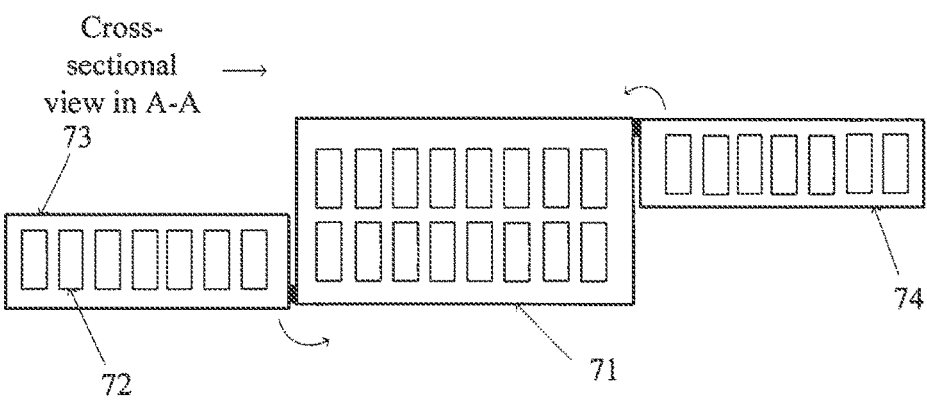
FIG. 7 is a cross-sectional view of another hard disk in a network storage device according to Embodiment 4 of the present disclosure in an A-A direction in FIG. 3.

FIG. 7 is a cross-sectional view of another hard disk in a network storage device according to Embodiment 4 of the present disclosure in an A-A direction in FIG. 3. As shown in FIG. 7, based on Embodiment 3 described above, at least one row of hard disks is installed on an inner door wall of a front door 73 from top to bottom, and all hard disks are deployed in one row in a horizontal direction of a cabinet 71. At least one row of hard disks is installed on an inner door wall of a rear door 74 from top to bottom, and all hard disks 72 are deployed in one row in the horizontal direction of the cabinet 71. Furthermore, the front door 73 and a left side wall of the cabinet 71 are connected using a movable bolt, and the front door 73 may be rotated counterclockwise by 180 degrees to be aligned with a lower row of hard disks in the cabinet 71. The rear door 74 and a right side wall of the cabinet 71 are connected using a movable bolt, and the rear door 74 may be rotated counterclockwise by 180 degrees to be aligned with an upper row of hard disks in the cabinet 71.

Alternatively, based on Embodiment 3, at least one row of hard disks is installed on an inner door wall of a front door 73 from top to bottom, and all hard disks are deployed in one row in a horizontal direction of a cabinet 71. Further, the front door 73 and a left side wall of the cabinet 71 are connected using a movable bolt, and the front door 73 may be rotated counterclockwise by 180 degrees to be aligned with a lower row of hard disks in the cabinet 71.

Alternatively, at least one row of hard disks is installed on an inner door wall of a rear door 74 from top to bottom, and all hard disks are deployed in one row in a horizontal direction of a cabinet 71. Further, the rear door 74 and a right side wall of the cabinet 71 are connected using a movable bolt, and the rear door 74 may be rotated counterclockwise by 180 degrees to be aligned with an upper row of hard disks in the cabinet 71.

According to the network storage device in Embodiment 4 described above, a hard disk may be disposed only on a front door, or a hard disk may be disposed only on a rear door, or hard disks may be disposed on both a front door and a rear door, and a hard disk may be further disposed according to a requirement and a cabinet capacity.

In Embodiment 4 described above, a hard disk arrangement manner in which a quantity of hard disks on a front door and/or a rear door is increased to further increase a storage capacity of the network storage device is provided, and when the quantity of hard disks deployed on the front door and/or the rear door is increased to increase the storage capacity, it is convenient to maintain each row of hard disks.

Figure 8:
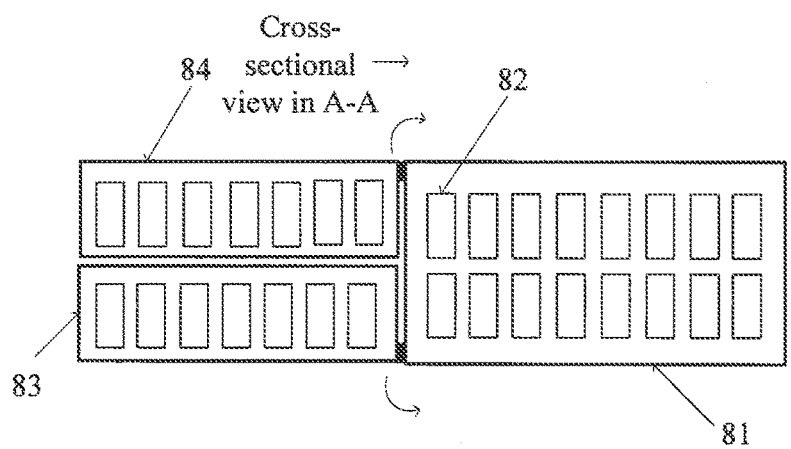
FIG. 8 is a cross-sectional view of still another hard disk in a network storage device according to Embodiment 5 of the present disclosure in an A-A direction in FIG. 3.

FIG. 8 is a cross-sectional view of still another hard disk in a network storage device according to Embodiment 5 of the present disclosure in an A-A direction in FIG. 3. Based on Embodiment 4, a rear door 84 and a front door 83 may be disposed on a same side of a cabinet 81. When the rear door 84 and the front door 83 are opened or closed in opposite directions, a structure that is of a network storage hard disk and facilitates expansion and maintenance in Embodiment 4 may also be implemented. In addition, compared with deposing of doors on two sides, deposing of doors on a same side may save a space, which facilitates deployment.

Finally, it should be noted that the foregoing embodiments are merely intended for describing the technical solutions of the present disclosure but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof. However, these modifications or replacements do not make the essence of corresponding technical solutions depart from the scope of the technical solutions in the embodiments of the present disclosure.

What is claimed is:

1. A network storage device, comprising:
   a cabinet;
   a network switch; and
   a hard disk area,
   wherein the network switch and the hard disk area are installed inside the cabinet,
   wherein the hard disk area comprises hard disks,
   wherein each hard disk in the hard disk area and the network switch has a same-protocol-based interface,
   wherein the hard disks and the network switch are coupled to each other,
   wherein the cabinet has a front door and a rear door, and
   wherein the hard disks are installed directly on an inner door wall of at least one of the front door and the rear door.

2. The network storage device according to claim 1, wherein the network storage device further comprises a heat dissipation apparatus, and wherein the heat dissipation apparatus is disposed inside the cabinet.

3. The network storage device according to claim 2, wherein the network switch is located above the heat dissipation apparatus, and wherein the heat dissipation apparatus is located above the hard disk area.

4. The network storage device according to claim 2, wherein the heat dissipation apparatus comprises at least one heat dissipation component, and wherein the at least one heat dissipation component is successively deployed in a horizontal direction of the cabinet.

5. The network storage device according to claim 1, wherein the hard disks in the hard disk area are successively and vertically placed in the cabinet.

6. The network storage device according to claim 1, wherein the hard disks and the network switch are coupled using a cable or a printed circuit board (PCB).

7. The network storage device according to claim 1, wherein the front door and a left side wall of the cabinet are connected using a movable bolt.

8. The network storage device according to claim 1, wherein the rear door and a right side wall of the cabinet are connected using a movable bolt.

9. The network storage device according to claim 1, wherein each hard disk in the hard disk area uses Internet Protocol.

10. The network storage device according to claim 1, wherein the front door and the rear door are both mounted on a same side of the cabinet.

11. A network storage device, comprising:
    a cabinet comprising a front door and a rear door;
    a network switch installed inside the cabinet; and
    a plurality of hard disks installed inside the cabinet and coupled to the network switch,
    wherein the hard disks are mounted directly on an inner door wall of at least one of the front door and the rear door.

12. The network storage device according to claim 11, wherein the network storage device further comprises a heat dissipation apparatus, and wherein the heat dissipation apparatus is disposed inside the cabinet.

13. The network storage device according to claim 12, wherein the network switch is located above the heat dissipation apparatus, and wherein the heat dissipation apparatus is located above the hard disks.

14. The network storage device according to claim 12, wherein the heat dissipation apparatus comprises at least one heat dissipation component, and wherein the at least one heat dissipation component is successively deployed in a horizontal direction of the cabinet.

15. The network storage device according to claim 11, wherein the hard disks and the network switch are coupled using a cable or a printed circuit board (PCB).

16. The network storage device according to claim 11, wherein the front door and the rear door are both mounted on a same side of the cabinet.

17. The network storage device according to claim 11, wherein the front door and the rear door are both mounted on different sides of the cabinet.

18. A network storage device, comprising:
a cabinet comprising a front door and a rear door;
a network switch installed inside the cabinet;
a heat dissipation apparatus installed inside the cabinet below the network switch; and
a plurality of hard disks installed inside the cabinet below the heat dissipation apparatus and coupled to the network switch,
wherein the hard disks are attached directly to an inner door wall of at least one of the front door and the rear door.

19. The network storage device according to claim 18, wherein the front door and the rear door are both mounted on a same side of the cabinet.

20. The network storage device according to claim 18, wherein the front door and the rear door are both mounted on different sides of the cabinet.

* * * * *